United States Patent
Kojima et al.

(10) Patent No.: US 12,549,133 B2
(45) Date of Patent: Feb. 10, 2026

(54) ISOLATOR

(71) Applicant: Inter-University Research Institute Corporation, National Institutes of Natural Sciences, Mitaka (JP)

(72) Inventors: Takafumi Kojima, Tokyo (JP); Sho Masui, Tokyo (JP); Yoshinori Uzawa, Tokyo (JP)

(73) Assignee: Inter-University Research Institute Corporation, National Institutes of Natural Sciences, Tokyo (JP)

( * ) Notice: Subject to any disclaimer, the term of this patent is extended or adjusted under 35 U.S.C. 154(b) by 349 days.

(21) Appl. No.: 18/485,112

(22) Filed: Oct. 11, 2023

(65) Prior Publication Data

US 2024/0146246 A1   May 2, 2024

(30) Foreign Application Priority Data

Oct. 27, 2022 (JP) .................................. 2022-172655

(51) Int. Cl.
*H03D 7/14* (2006.01)
*H03D 7/16* (2006.01)

(52) U.S. Cl.
CPC ............... *H03D 7/14* (2013.01); *H03D 7/165* (2013.01)

(58) Field of Classification Search
CPC .................................. H03D 7/165; H03D 7/14
USPC ....................................................... 455/207
See application file for complete search history.

(56) References Cited

U.S. PATENT DOCUMENTS

| | | | |
|---|---|---|---|
| 5,937,006 A * | 8/1999 | Clark | H04B 17/391 |
| | | | 324/76.23 |
| 8,706,067 B1 | 4/2014 | Anvari | |
| 12,445,226 B2 * | 10/2025 | Hajimiri | H04B 7/0667 |
| 2011/0033003 A1 | 2/2011 | Kumar | |

FOREIGN PATENT DOCUMENTS

| | | |
|---|---|---|
| JP | 2004-032446 | 1/2004 |
| WO | 2019/018034 | 1/2019 |

OTHER PUBLICATIONS

Zeng et al., "A Low-Loss Edge-Mode Isolator With Improved Bandwidth for Cryogenic Operation", IEEE Transactions on Microwave Theory and Techniques, vol. 66, No. 5, pp. 2154-2160 (2018).
Abdo et al., "High-Fidelity Qubit Readout Using Interferometric Directional Josephson Devices", PRX Quantum 2, 040360 (2021), 34 pages.

(Continued)

*Primary Examiner* — Sam K Ahn
(74) *Attorney, Agent, or Firm* — HSML P.C.

(57) ABSTRACT

In an isolator, frequency mixers are connected to each other in tandem, a local oscillator is connected to both of the frequency mixers and configured to input a local signal with the same frequency to both of the frequency mixers, the frequency of the signal input to one of the frequency mixers is up-converted by the local signal, then input to the other of the frequency mixers and down-converted, a phase delayer is configured to delay the phase of the signal with the frequency up-converted by the frequency mixer, and a phase shifter is configured to convert the phase of the local signal to cause the phase difference between the two frequency mixers.

8 Claims, 7 Drawing Sheets

(56) References Cited

OTHER PUBLICATIONS

Chapman et al., "Widely Tunable On-Chip Microwave Circulator for Superconducting Quantum Circuits", Physical Review X 7, 041043 (2017), 16 pages.
Montazeri et al., "Ultra-Low-Power Cryogenic SiGe Low-Noise Amplifiers: Theory and Demonstration", IEEE Transaction on Microwave Theory and Techniques, vol. 64, No. 1, pp. 178-187 (2016).
Eom et al., "A wideband, low-noise superconducting amplifier with high dynamic range", Nature Physics, vol. 8, pp. 623-627 (2012).
Kojima et al., "Microwave amplification based on quasiparticle SIS up and down frequency converters," AIP Advances, vol. 8, No. 2, 025206 (2018), 7 pages.
Uzawa et al., "An SIS-mixer-based amplifier for multi-pixel heterodyne receivers," Proc. SPIE, vol. 11453 (2020), 8 pages.
Japanese Office Action, issued in the corresponding Japanese Patent Application No. 2022-172655, dated Mar. 7, 2025, 9 pages with the machine translation.

* cited by examiner

ISOLATOR

CROSS-REFERENCE TO RELATED APPLICATION

This application claims priority from Japanese Patent Application No. 2022-172655 filed on Oct. 27, 2022. The entire subject matter of the Japanese Patent Applications is incorporated herein by reference.

BACKGROUND

Isolators are non-reciprocal circuit elements which transmit progressive waves including input signals with low loss, while attenuating regressive waves include reflected waves. In the field of radio astronomy, isolators are used, for example, in apparatuses for detecting feeble radio waves (such as microwaves) from space.

SUMMARY

An isolator includes a first frequency mixer, a second frequency mixer, a local oscillator, a phase delayer and a phase shifter. The first frequency mixer and the second frequency mixer are connected in series, and the local oscillator is connected to the first frequency mixer and the second frequency mixer and is configured to input a local signal with the same frequency to the first frequency mixer and the second frequency mixer. A signal targeted for isolation can be input to the first frequency mixer, and a frequency of the signal input to the first frequency mixer is up-converted by the local signal; the signal with the up-converted frequency is input to the second frequency mixer; and then a frequency of the signal with the up-converted frequency is down-converted. The signal with the down-converted frequency is output from the second frequency mixer, the phase delayer is configured to delay a phase of the signal with the frequency up-converted by the first frequency mixer, and the phase shifter is configured to convert a phase of the local signal to create a phase difference between the first frequency mixer and the second frequency mixer.

DETAILED DESCRIPTION

In an isolator, the phase delay of a signal and a phase difference are defined by the following equations (A) and (B). $\Phi_{up}0$ (degree) in the equation (A) and $\Phi_{LO}0$ (degree) in the equation (B) can be set so that the gain of the progressive wave that moves in the direction of the signal transmission becomes larger than the gain of the regressive wave that moves in the opposite direction to the direction of the signal transmission.

$$\Phi_{up}(\text{degree}) = \Phi_{up}0(\text{degree}) + 180(\text{degree}) \times n \qquad \text{Equation (A)}$$

$\Phi_{up}$ (degree): amount of phase delay
n: integer $$\Phi_{LO}(\text{degree}) = \Phi_{LO}0(\text{degree}) + 180(\text{degree}) \times m \qquad \text{Equation: (B)}$$

$\Phi_{LO}$ (degree): phase difference
m: integer

With regard to Equations (A) and (B) above, the combination of the $\Phi_{up}0$ and the $\Phi_{LO}0$ can be appropriately set according to, for example, where the phase shifter is connected (for example, whether the phase shifter is connected to the first frequency mixer or the second frequency mixer). As an example, when the phase shifter is connected to the second frequency mixer and the phase difference is that between the local signal input to the second frequency signal and the local signal input to the first frequency mixer, when the $\Phi_{up}0=45°$ and the $\Phi_{LO}0=45'$ are satisfied, the gain of the progressive wave is at its maximum and the gain of the regressive wave is at its minimum. Therefore, the isolation function achieves maximum efficiency. When the phase shifter is connected to the first frequency mixer and the phase difference is that between the local signal input to the first frequency signal and the local signal input to the second frequency mixer, when the $\Phi_{up}0=45°$ and the $\Phi_{LO}0=135°$ are satisfied, the gain of the progressive wave is at its maximum and the gain of the regressive wave is at its minimum. Therefore, the isolation function achieves maximum efficiency. Also, the direction of the isolation can be reversed by appropriately setting the combination of the $\Phi_{up}0$ and the $\Phi_{LO}0$. Isolation does not occur when $\Phi_{LO}0=0°$ or 90° is satisfied because the gain of the progressive wave is the same as the gain of the regressive wave. Accordingly, $\Phi_{LO}0$ may be set to values besides 0° or 90°.

In the isolator, the first frequency mixer and the second frequency mixer may be SIS quasiparticle mixers that include a superconductor-insulator-superconductor (SIS) junction structure. SIS quasiparticle mixers operate as double side band (DSB) mixers, with respect to a local oscillation frequency signal that is larger than a gap frequency, which is a frequency conversion ($e\Delta Vg/h$; e is elementary charge, h is Planck constant) of a gap voltage amplitude ($\Delta Vg$) at a temperature that is lower than the temperature at which SIS operates as a super conducting element. The SIS quasiparticle mixers can be formed on a substrate to reduce a size of the isolator. Also, a frequency mixer for use in the isolator may be, for example, a general frequency mixer for microwaves which does not use a super conducting element. Examples of the mixers other than the SIS quasiparticle mixers include Josephson mixers and HEB (hot electron bolometer) mixers. In the present disclosure, SIS quasiparticle mixers may be used, from the viewpoint of a conversion gain or the like.

In at least one embodiment, the isolator may further include a voltage applier that is configured to apply a bias voltage to the first frequency mixer (the first quasiparticle mixer) and the second frequency mixer (the second quasiparticle mixer), with the bias voltage being more appropriate for the first frequency mixer than for the second frequency mixer. In the present embodiment, the bias voltage applied to the first quasiparticle mixer and the second quasiparticle mixer may be different or the same. In SIS mixers with the same bias voltage, gains are different between, e.g., when the up-conversion occurs and the down-conversion occurs. The progressive wave is, e.g., up-converted in the first frequency mixer and down-converted in the second frequency mixer. The regressive wave is, e.g., up-converted in the second frequency mixer and down-converted in the first frequency mixer. Hence, "the bias voltage that is more appropriate for the first frequency mixer than for the second frequency mixer" means, for example, that the voltage at which the gain of the progressive wave up-converted in the first frequency mixer (Gmix1up) is larger than the gain of the regressive wave down-converted in the first frequency mixer (Gmix1down) (Gmix1up>Gmix1down), and the gain of the progressive wave down-converted in the second frequency mixer (Gmix2down) is larger than the gain of the regressive wave up-converted in the second frequency mixer (Gmix2up) (Gmix2down>Gmix2up). It is possible to obtain a gain difference between the progressive wave and the regressive wave by setting bias voltage to satisfy the conditions listed above, for example.

In an embodiment that includes a voltage applier, the phase delayer and the phase shifter may be optional components. In other words, in an embodiment that includes a voltage applier, the isolator works without the phase delayer or the phase shifter. Accordingly, in such an embodiment, the isolator may include at least one of the phase delayer and the phase shifter.

In the isolator, the first frequency mixer and the second frequency mixer may be mounted (or formed) on the same substrate. The present embodiment allows integration on a large scale, and in addition to both the frequency mixers, at least one of the local oscillator, the phase delayer, or the phase shifter may be mounted (or formed) on the same substrate, while other elements may also be mounted (or formed) on the same substrate.

In the isolator, when using a rectangular waveguide with frequency selectivity in the channel itself as a channel of the signal, for example, it is possible to filter the transmitting signal, with the use of characteristic of cutoff frequency of the rectangular waveguide. Also, when using a strip line or the like which is not frequency selective as a channel of the signal, a filter can be installed in each the first frequency mixer (up-converter) and the second frequency mixer (down-converter) to each select a certain frequency component.

In the isolator, the local signal may be input to the first frequency mixer and the second frequency mixer from one or more local oscillators. A local oscillator is not particularly limited, and, for example, a Josephson Oscillator can be used. Josephson oscillators operate in the THz band at a low temperature and achieve a high degree of integration. In the process of producing a Josephson oscillator, superconducting films for a SIS quasiparticle mixer and a Josephson oscillator can be formed on the same film, so that the SIS quasiparticle mixer and the local oscillator can be formed on the same substrate. In at least one example embodiment, besides a Josephson oscillator, a device used for the local oscillator also includes a FFO (Flux Flow Oscillator) which is a superconducting element. Further, in accordance with at one other example embodiment, a device having a phase control circuit can be used as a phase delayer and a phase shifter. Examples of the phase control circuit include a transmitting line with the characteristic of delaying phase, a delay element caused by a distributed constant circuit, and a lumped parameter element such as an inductor or the like. The phase shifter operates by connecting the transmitting line, the delay element, or the lumped parameter element and the like, to at least one of the first and the second frequency mixers, to cause a phase difference in both the local signal of the first frequency mixer and the second frequency mixer.

In the isolator, the signal may be a microwave, and, in such a case, the isolator is for microwave uses.

The isolator may also operate as a unidirectional amplifier.

A superconducting electronic device includes the isolator. In the present embodiment, the superconducting electronic device may configure the whole or the part of an electronic telescope or a quantum computer.

EXAMPLES

Example 1

The operating principle of the isolator is explained as follows based on FIG. 1 and FIG. 2.

Figure 1:
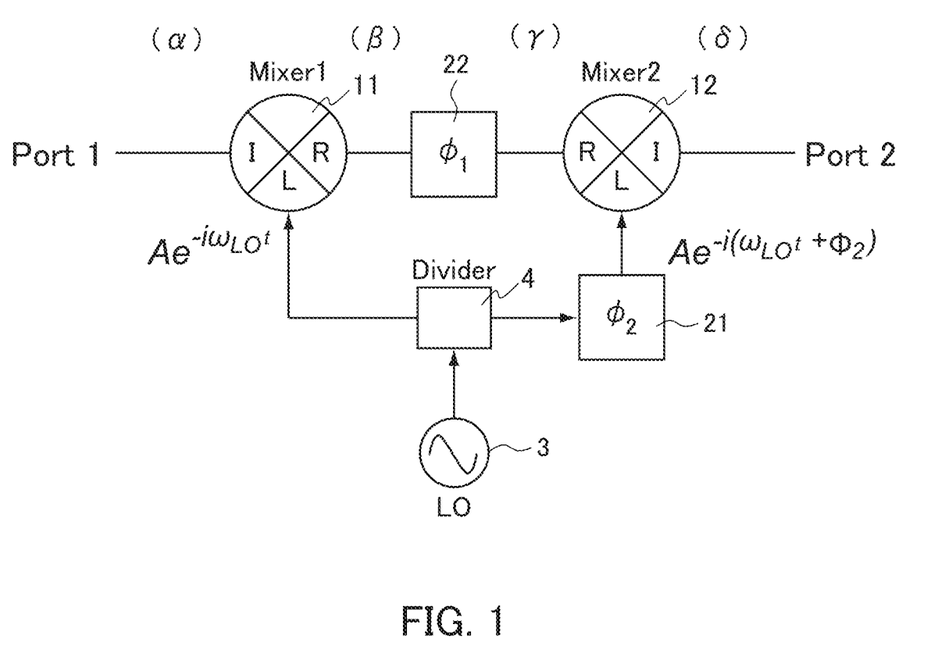
FIG. 1 is a circuit diagram showing the configuration of the isolator of Example 1.

First, FIG. 1 shows a circuit diagram of the isolator of the present example embodiment. As shown in FIG. 1, the isolator of the present example embodiment is composed of two frequency mixers (Mixer 1, Mixer 2) 11 and 12, two phase control circuits (Phase delayer Φ1, Phase shifter Φ2) 21 and 22, one divider (Divider) 4, and one local oscillator (LO) 3. The phase control circuits operate as the phase delayer (Φ1) 22 and the phase shifter (Φ2) 21. In FIG. 1, "I" indicates an intermediate frequency (IF) port, "R" indicates a radio frequency (RF) port, and "L" indicates a local oscillation (LO) port, in the frequency mixers 11 and 12. In the isolator shown in FIG. 1, a frequency $f_s$ of a signal input from the port 1 (Port 1), is up-converted to $f_{up}=f_{LO} \pm f_s$ in the first frequency mixer (Mixer 1) 11, by a frequency $f_{LO}$ of the local signal input from the local oscillator (LO) 3, then down-converted to $f_s$ in the second frequency mixer (Mixer 2) 12, and output to port 2 (Port 2).

The two frequency mixers (Mixer 1, Mixer 2) 11 and 12 are connected to each other via the phase delayer (Φ1) 22, which delays a phase of a frequency up-converted. The local oscillator (LO) 3 is connected to the divider (Divider) 4, wherein the divider (Divider) 4 is connected to each of the frequency mixers (Mixer 1, Mixer 2) 11 and 12 with two transmitting lines. The phase shifter (Φ2) 21 is disposed in the transmitting line connected to the frequency mixer (Mixer 2) 12. The local signal caused by the local oscillator (LO) 3 is distributed to the frequency mixers (Mixer 1, Mixer 2) 11 and 12 by the divider (Divider) 4. The local signal distributed to the frequency mixer (Mixer 2) 12 is converted into the local signal at the phase difference of Φ2, by the phase shifter (Φ2) 21, on the basis of the local signal distributed to the frequency mixer (Mixer 1) 11. The phase difference of Φ2 is a phase difference produced assuming that the frequency mixer (Mixer 1) 11 is an appropriate transmitting line and the phase delay is 0. Each of the local signals at the phase difference of Φ2 is input to each of the frequency mixers (Mixer 1, Mixer 2) 11 and 12. The phase difference is also produced in the signal with the up-converted frequency, between the frequency mixers (Mixer 1, Mixer 2) 11 and 12, by the phase delayer (Φ1) 22. Note that the present disclosure is not limited to the configuration of FIG. 1. For example, the phase shifter (Φ2) 21 may be disposed in the transmitting line connected to the frequency mixer (Mixer 1) 11, and, in such a case, the isolator operates as an isolator by adjusting the combination of the amount of phase delay of Φ2 and the phase difference of Φ1.

In the isolator of FIG. 1, in the progressive wave, whereby an input signal is input from the port 1 (Port 1) and output from port 2 (Port2), the frequency of the input signal is the same as the frequency of the output signal. Further, in the isolator of FIG. 1, the isolation of the input signal is caused by setting conditions of the phase difference and the phase delay. As the isolator does not use a band limitation device, the isolator can operate in broadband, for example, within a range from almost direct current to local oscillation (LO) frequency. Note that among the two frequency mixers of the isolator, the mixer that first inputs a signal from exterior is the first frequency mixer, and the mixer that outputs the signal to exterior is the second frequency mixer. Thus, in the isolator shown in a circuit diagram of FIG. 1, when inputting a signal from the port 1 to the frequency mixer (Mixer 1) 11, the frequency mixer (Mixer 1) 11 is the first frequency mixer, and the frequency mixer (Mixer 2) 12 is the second frequency mixer. On the other hand, when inputting a signal from the port 2, the frequency mixer (Mixer 2) 12 is the first frequency mixer, and the frequency mixer (Mixer 1) 11 is the second frequency mixer.

Next, the operating principle of the isolator of FIG. 1 is shown as follows.

First, a voltage of a signal input to the port 1 of the frequency mixer (Mixer 1) 11 can be expressed by the following Equation 1.

$$V_{in} = V_0 e^{-j\omega_{in} t} \quad \text{[Equation 1]}$$

$V_0$: Voltage amplitude with respect to an input signal
$\omega_{in}$: Input angular frequency In the Equation 1, $V_0=1$. Also, local oscillation voltages ($V_{LO1}$, $V_{LO2}$) applied to the frequency mixers (Mixer 1, Mixer 2) 11 and 12 can be expressed by the following Equation 2, using the phase difference of $\Phi 2$.

$$V_{LO1} = A e^{-j\omega_{LO} t}$$

$$V_{LO2} = A e^{-j(\omega_{LO} t + \Phi 2)} \quad \text{[Equation 2]}$$

A: Voltage amplitude of local oscillator
$\omega LO$: Angular frequency of local oscillator $V_{in}$ in the Equation 1 is up-converted by the frequency mixer (Mixer 1) 11 at (β) of FIG. 1, converted into the following Equation 3. In the right side of the following Equation 3, the initial term shows the upper side band (USB) signal, and the second term shows the lower side band (LSB) signal.

$$V_{up} = \sqrt{G_S} e^{-j(\omega_{LO}+\omega_{in})t} + \sqrt{G_S} e^{-j(\omega_{LO}-\omega_{in})t} \quad \text{[Equation 3]}$$

$G_S$: Same conversion gains for each sideband

In the Equation 3, a signal $V_{up}$ is an up-converted frequency which delays at the phase difference of $\Phi 1$. Upon being delayed, the signal $Vu_p$ is converted into the signal $Vu_p$ expressed by the following Equation 4 at (γ) of FIG. 1

$$V_{up}\sqrt{G_S} e^{-j\{(\omega_{LO}+\omega_{in})t + \Phi 1\}} + \sqrt{G_S} e^{-j\{(\omega_{LO}-\omega_{in})t + \Phi 1\}} \quad \text{[Equation 4]}$$

Thereafter, at (δ) of FIG. 1, the signal $V_{up}$ in the Equation 4, is down-converted by the frequency mixer (Mixer 2) 12, and converted into the output voltage $V_{21}$ expressed by the following Equation 5, with the same frequency as the input frequency.

$$V_{21} = G_S e^{-j(\omega_{in} t + \Phi 1 - \Phi 2)} + G_S e^{-j(\omega_{in} t - \Phi 1 + \Phi 2)}. \quad \text{[Equation 5]}$$

On the other hand, the output voltage $V_{12}$ of the signal (regressive wave) transmitted to the port 1 from the port 2, can be calculated as the following Equation 6.

$$V_{12} = G_S e^{-j(\omega_{in} t + \Phi 1 + \Phi 2)} + G_S e^{-j(\omega_{in} t - \Phi 1 - \Phi 2)}. \quad \text{[Equation 6]}$$

Both Equation 5 and Equation 6 show that two output voltage of the upper side band (USB) signal and the lower side band (LSB) signal are combined under different phase conditions, so that no reciprocity or an isolation is caused, according to the phase relations set in the phase delayer ($\Phi 1$) 22 and the phase shifter ($\Phi 2$) 21.

Figure 2A:
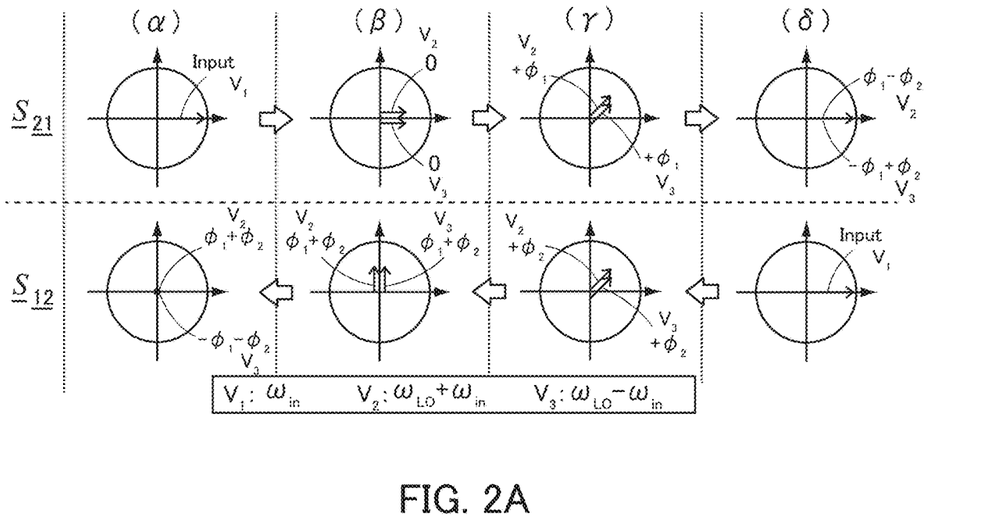
FIG. 2A and FIG. 2B show the operating principle of the isolator of Example 1.
Figure 2B:
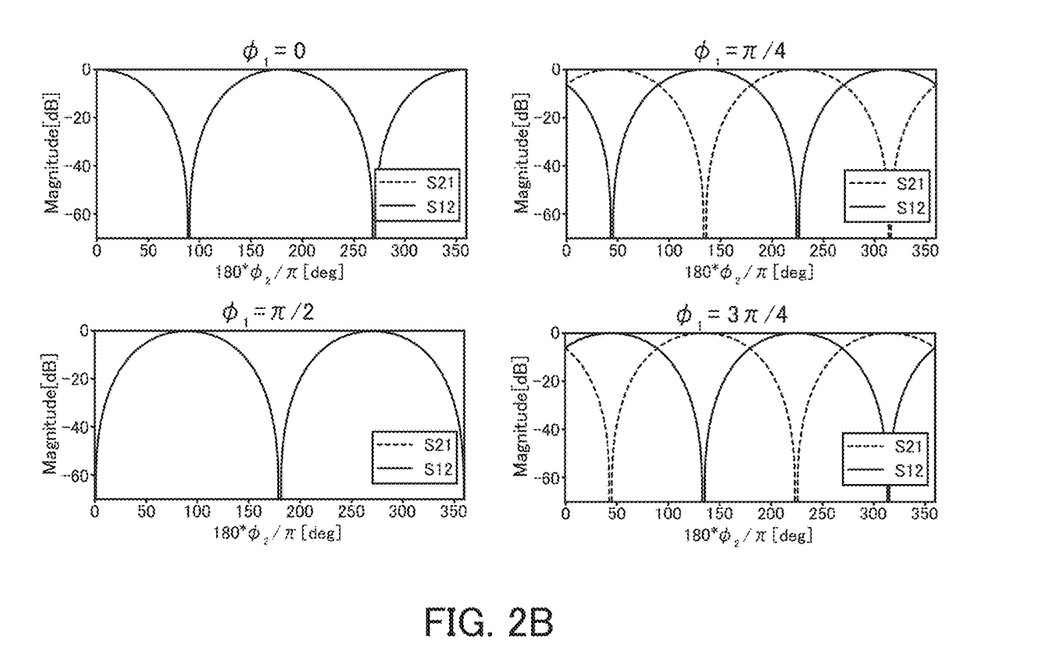

Next, based on each of the Equation 5 and the Equation 6, FIG. 2A shows vector diagrams of sidebands at (α), (β), (γ), and (δ) of FIG. 1. Also in FIG. 2A, in the progressive wave S21 moving to the port 2 from the port 1, two sidebands are combined at the same phase, while the sidebands in the regressive wave S12 moving to the port 1 from the port 2 are canceled each other out at antiphase. Also, FIG. 2B shows the change of gains (dB) of the progressive wave S21 (shown with dotted line) and the regressive wave S12 (shown with actual line), when the amount of phase delays ($\Phi 1$) is each 0, π/4, π/2, and 3π/4, within the phase difference of 0 to 360°. As shown in FIG. 2B, when the amount of phase delay ($\Phi 1$) is 0 or π/2, the change of the gains of the progressive wave S21 and the regressive wave S12 are the same. When the amount of phase delay ($\Phi 1$) is π/4 or 3π/4, and the phase difference ($\Phi 2$) is π/4+nπ/2 (n is an integer larger than 0), the gains change in mutually opposite directions and the isolation function becomes the optimum. For example, when the amount of phase delay ($\Phi 1$) is 45° (π/4) and the phase difference ($\Phi 2$) is 45° (π/4), or when the amount of phase delay ($\Phi 1$) is 1350 (3π/4) and the phase difference ($\Phi 2$) is 135° (3π/4), the gain of the progressive wave S21 moving to the port 2 from the port 1 achieves the maximum, and the gain of the regressive wave S12 moving to the port 1 from the port 2 achieves the minimum. As a result, in the aforementioned cases, the isolation function in the direction from the port 1 to the port 2 achieves the maximum. In the isolator of FIG. 1, the direction of the progressive wave changes according to the combinations of different phases, for example, when (1 is 45° and ($\Phi 2$) is 135°. Further, when the amount of phase delay ($\Phi 1$) is π/2, and the phase difference ($\Phi 2$) is (n+1) π/2 (n: integer), the device shown in the circuit diagram FIG. 1 operates as a gyrator.

Example 2

Next, an example of the isolator configured with commercially available components and devices (Example 2), is shown as follows.

For the two frequency mixers, the frequency mixers (product number: ZX05-C42-S+, manufactured by Mini-circuits) were used. These frequency mixers cover the RF and LO frequency band from 1.0 to 4.2 GHz and the IF frequency band from DC (almost direct current) to 1.5 GHz. For a tunable phase shifter, the phase shifter (product number: PE8244, manufactured by Pasternack Enterprises, Inc.) was used to cause a phase delay between the frequency mixers, and to cause a phase difference in the local signal to be input to each of the frequency mixers. Besides the aforementioned devices, a local signal oscillator (product number: N5183A, manufactured by Agilent Technologies, Inc.), a divider (product number: ZX10-2-42-S+, manufactured by Scientific Components Corporation doing business as Mini-Circuits), and two attenuators (INMET® brand product number: 18AH-05.5 dB, manufactured by Spectrum Controls Inc. formerly API Technologies Corporation) were used.

Figure 3:
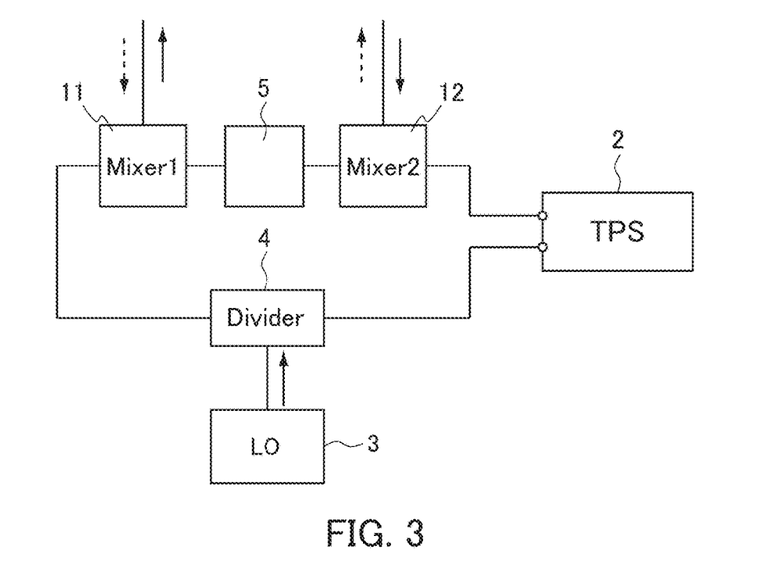
FIG. 3 shows the configuration of the isolator of Example 2.

FIG. 3 shows an isolator configured with the aforementioned devices. As shown in FIG. 3, in the isolator of the present example, a divider (Divider) 4 is connected to a local signal oscillator (LO) 3 with a circuit, a circuit extending from one side of the divider 4 is directly connected to one frequency mixer (Mixer 1) 11, a circuit extending from the other side of the divider 4 is connected to a phase shifter (TPS Tunable phase shifter) 2, and the phase shifter 2 is connected to the other frequency mixer (Mixer 2) 12 with a circuit. The two frequency mixers 11 and 12 are connected to each other via an attenuating circuit 5. The attenuating circuit 5 is configured by connecting the two attenuators (5 dB att) together with a connector. The attenuating circuit 5 is to prevent the isolation function from being degraded due to a reflection coefficient of frequency mixers being large.

Figure 4:
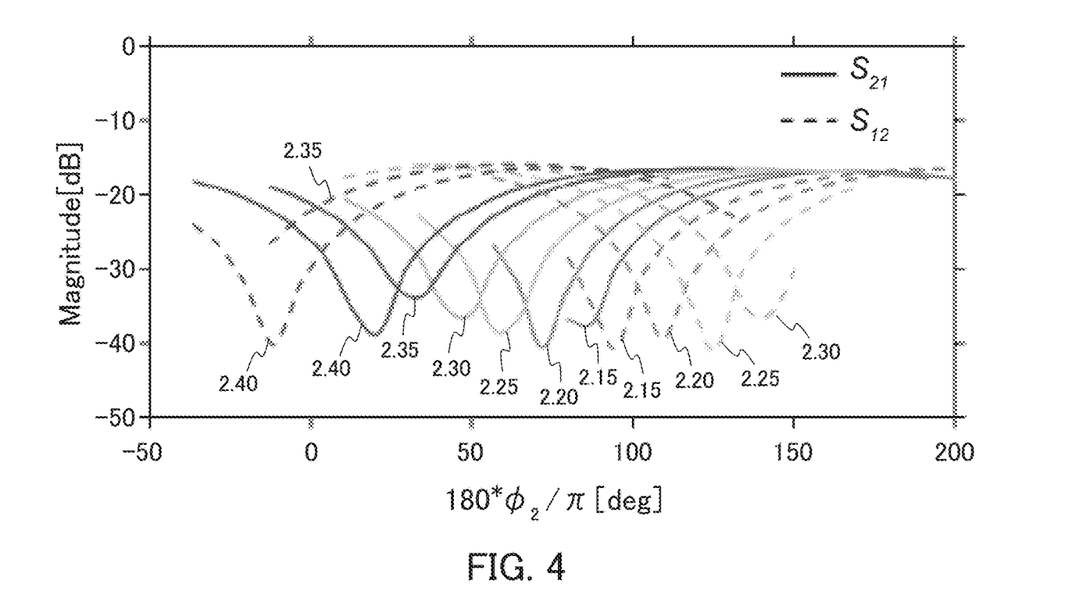
FIG. 4 is a graph showing example gains of the progressive wave S21 and the regressive wave S12, when amounts of phase delay are varied using the isolator of Example 2.

Next, gains of the progressive wave S21 and the regressive wave S12 were examined by changing the amount of phase delay. For measuring the progressive wave S21 and the regressive wave S12, a Vector Network Analyzer (VNA, product number: E8361C, manufactured by Agilent Technologies, Inc.) was used to measure the strength (gain dB) of the progressive wave S21 and the regressive wave S12 within the local oscillating frequency $\Phi_{LO}$ frequency) of 2.15 to 2.40 GHz with the input/output signal frequencies being 0.25 GHz. The result of the above measurement is shown in FIG. 4. Values (2.15 to 2.40) in the graph of FIG. 4 show LO frequencies (GHz). The measurement results when the LO frequencies were 2.15, 2.30, and 2.40 GHz were the same as for the calculation shown in FIG. 2. Also, the result of the measurement when the LO frequency was 2.30 GHz clearly showed a function as an isolator. The isolation function achieved the maximum at $41.6\times\pi/180$.

Figure 5:
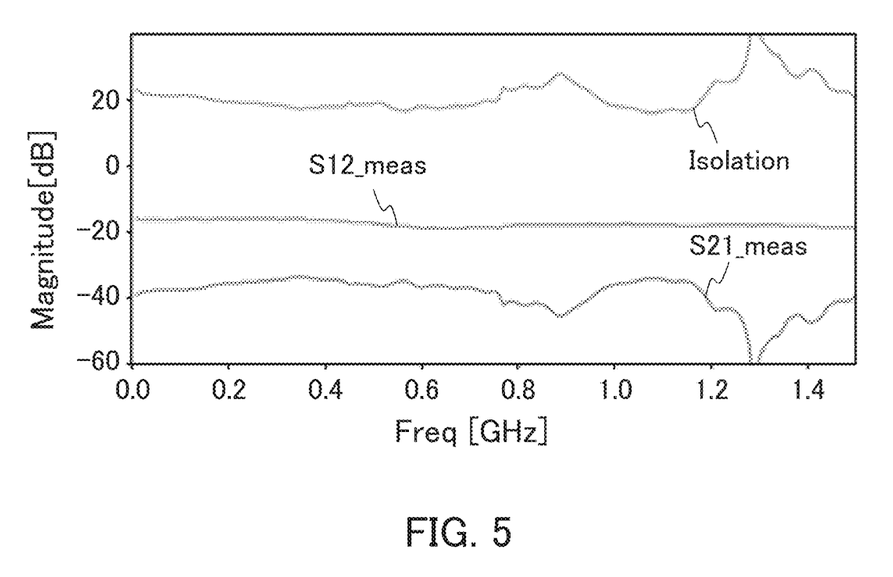
FIG. 5 is a graph showing an example frequency characteristic of the isolator of Example 2.

FIG. 5 shows the frequency characteristic of the isolator of the present example. In FIG. 5, S21meas shows the gain (dB) of the progressive wave, S12meas shows the gain (dB) of the regressive wave, and Isolation shows the gain (dB) of the isolation. As can be seen from FIG. 5, the highest line showing contrast between the progressive wave S21meas and the regressive wave S12meas indicates the isolation, the lowest point of the isolation is 17 dB. These showed that, the isolation effect of approximately 17 dB or more can be obtained within 0.01 to 1.50 GHz of signal frequency, as shown in FIG. 5.

Example 3

Figure 6:
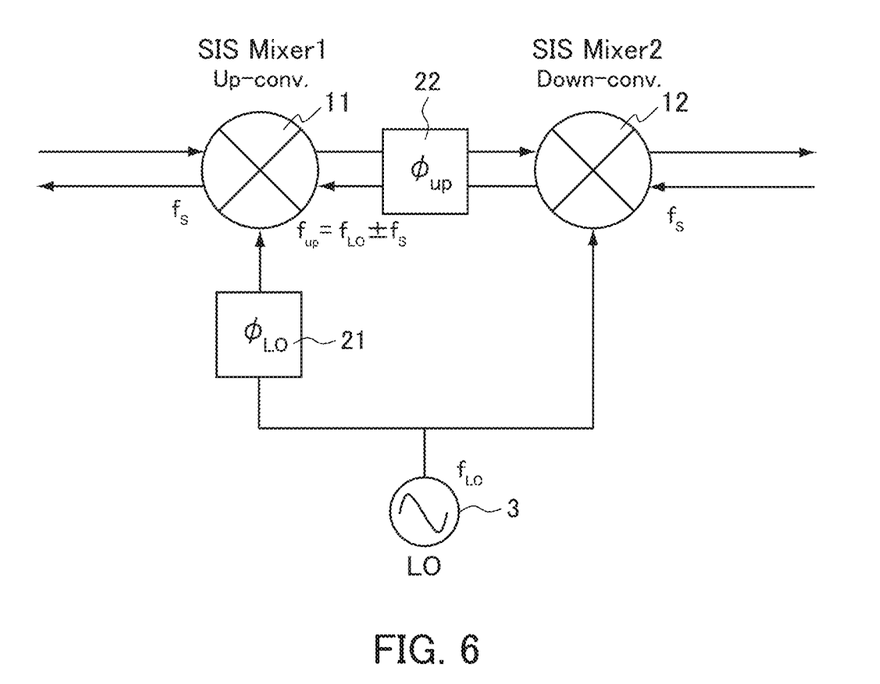
FIG. 6 is a circuit diagram of the isolator of Example 3.

FIG. 6 shows a circuit diagram of the isolator including SIS quasiparticle mixers (Example 3). As shown in FIG. 6, the SIS quasiparticle mixer 11 (SIS Mixer 1 Up-conv.) and the SIS quasiparticle mixer 12 (SIS Mixer 2 Down-conv.) are connected to each other in series, and a phase delayer 22 ($\varphi_{up}$) is disposed between the two SIS quasiparticle mixers 11 and 12. The SIS quasiparticle mixers 11 and 12 are W band (75-110 GHz) SIS quasiparticle mixers. A local signal $f_{LO}$ is input to the SIS quasiparticle mixer 11 from a local oscillator 3 via a phase shifter 21. To the SIS quasiparticle mixer 12, the local signal $f_{LO}$ is directly input. In a circuit shown in FIG. 6, a frequency of a signal $f_s$ targeted for the isolation is up-converted to $f_{up}=f_{LO}\pm f_s$ by the SIS quasiparticle mixer 11, then down-converted to the frequency $f_s$ by the SIS quasiparticle mixer 12.

Figure 7:
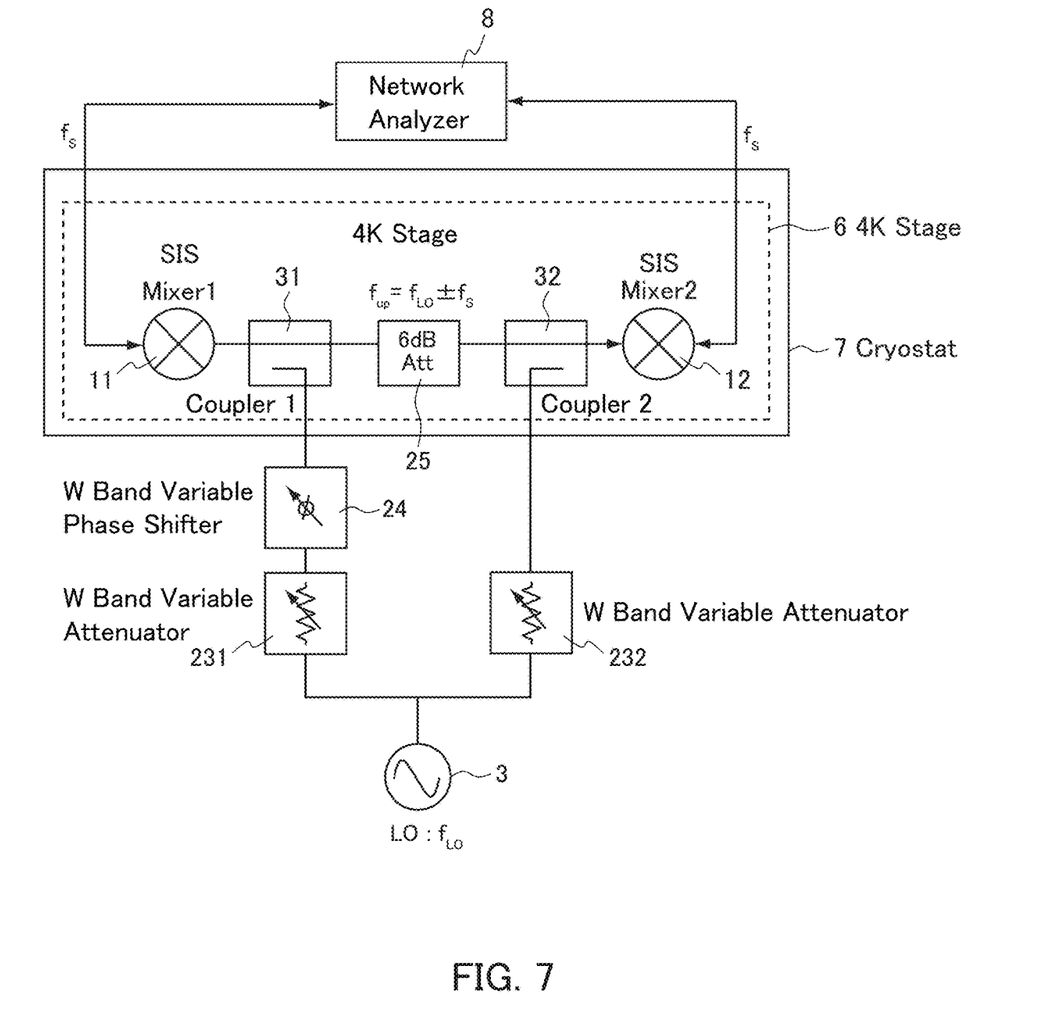
FIG. 7 is a block diagram of the isolator of Example 3.

FIG. 7 shows the configuration of the isolator of the present example. As shown in FIG. 7, a 4K stage (a cryogenic stage) 6 is formed on a cryostat (a device to maintain low temperature) 7, and the two SIS quasiparticle mixers (SIS Mixer 1, SIS Mixer 2) 11 and 12 are disposed on the 4K stage 6. Note that 4K indicates very low temperature (for example, temperature near the boiling point of liquid helium). The SIS quasiparticle mixer 11 is connected to a coupler (Coupler 1) 31, the coupler 31 is connected to an attenuator (Att 6 dB) 25, the attenuator 25 is connected to a coupler (Coupler 2) 32, and the coupler 32 is connected to the SIS quasiparticle mixer 12. A local oscillator (LO) 3 is disposed at the exterior of the 4K stage and connected to the coupler 31 via a W band variable attenuator 231 and a W band variable phase shifter 24. Also, the local oscillator 3 is connected to the coupler 32 via a W band variable attenuator 232. The two SIS quasiparticle mixers 11 and 12 are connected to a network analyzer (product number: N5225B, manufactured by Keysight) 8 disposed at the exterior of the 4K stage.

In the block diagram of FIG. 7, a Gunn oscillator was used as the local oscillator 3, and the frequency LO of the local signal was set to be approximately 90 GHz. The couplers 31 and 32 disposed between the SIS quasiparticle mixers 11 and 12 are W band waveguide couplers. The attenuator 25 was inserted to reduce interference such as impedance between the two SIS quasiparticle mixers 11 and 12. The variable phase shifter 24 can cause a change of approximately 200 degrees to a relative phase in the W band.

In the isolator of the present example, the relative phase difference in the local signal input to the two SIS quasiparticle frequency mixers 11 and 12 was changed, by changing the local signal frequency LO by the variable phase shifter 24. Further, in the isolator of the present example, the up-converted frequency was changed, and the phase of up-conversion $\Phi_p$ was relatively changed, by changing the local signal frequency LO. Note that the bias of the SIS quasiparticle mixers 11 and 12 was fixed to be voltage 9.2 mV and current 50 µA. These results are shown in graphs of FIG. 8.

Figure 8:
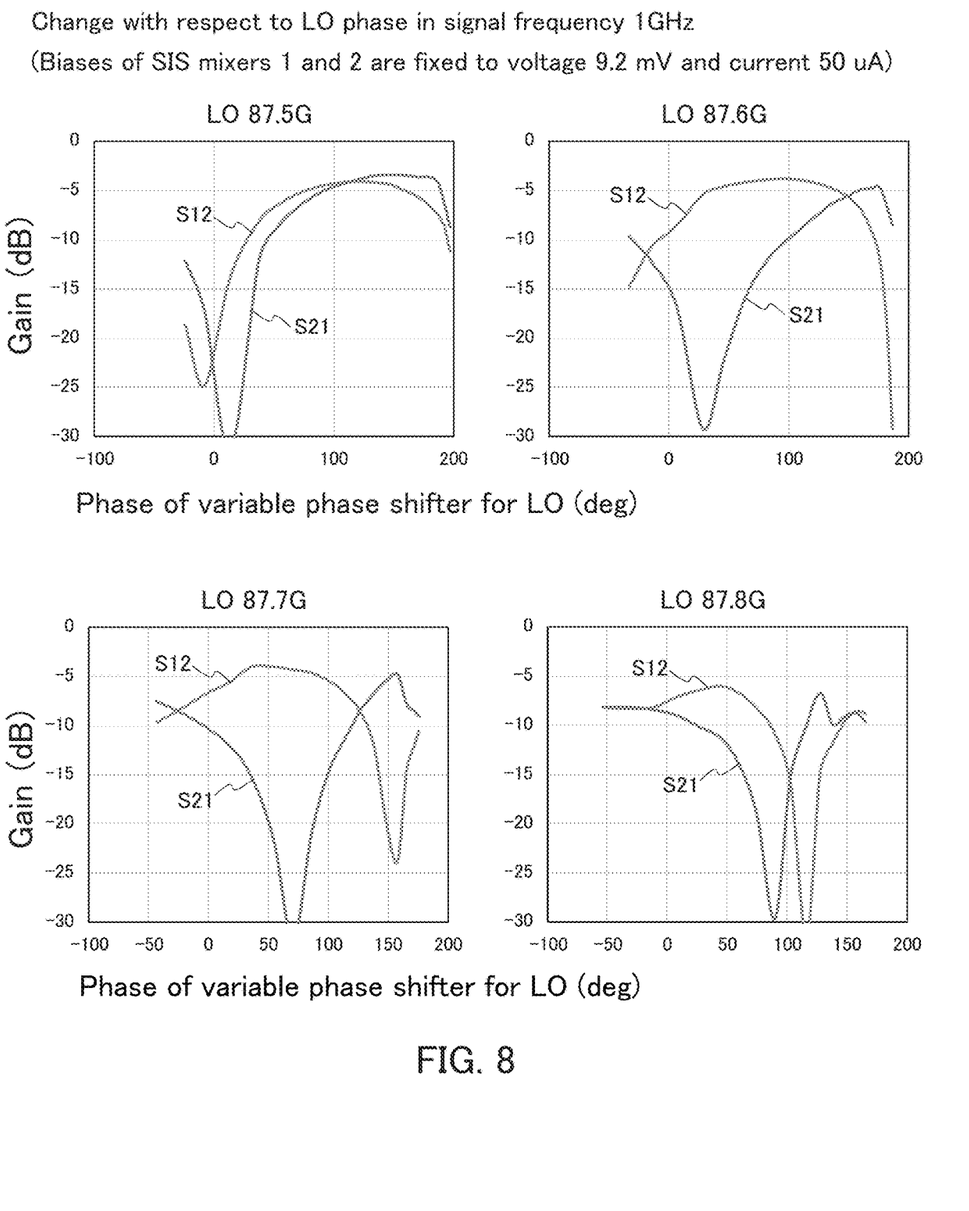
FIG. 8 shows graphs showing a function of the isolator of Example 3.

As shown in graphs of FIG. 8, according to the change of the local signal frequency LO, the minimum peak values (signal cancellation frequencies) were observed in each of the progressive wave S21 and the regressive wave S12. Further, signal cancellation frequencies were demonstrated to be changed according to the values of the local signal frequency LO. The above results demonstrated that a large isolation effect can be obtained by controlling the phase of the local signal frequency LO and the phase of up-conversion in the configuration including the two SIS quasiparticle mixers 11 and 12.

Figure 9:
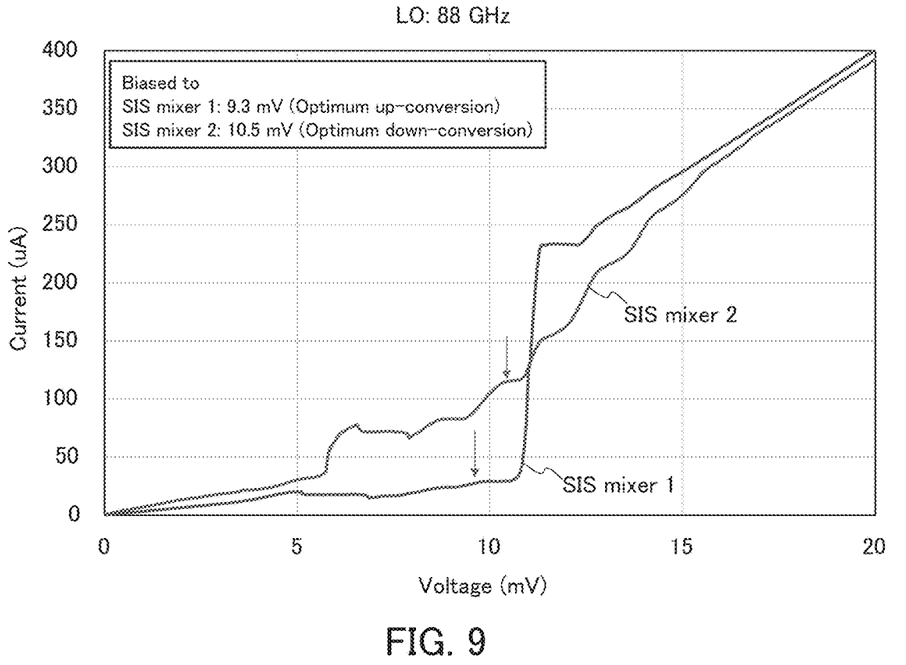
FIG. 9 is a graph showing a function of the isolator of Example 3.

FIG. 9 is a graph showing a relation of the voltage (Voltage mV) and the current (Current µA) when the local signal frequency LO is 88 GHz in the isolator of the present example. As shown in FIG. 9, in the SIS quasiparticle mixer 11, up-conversion is optimal at voltage 9.3 mV (as the arrow points), and in the SIS quasiparticle mixer 12, down-conversion is optimal at voltage 10.5 mV (as the arrow points).

Figure 10:
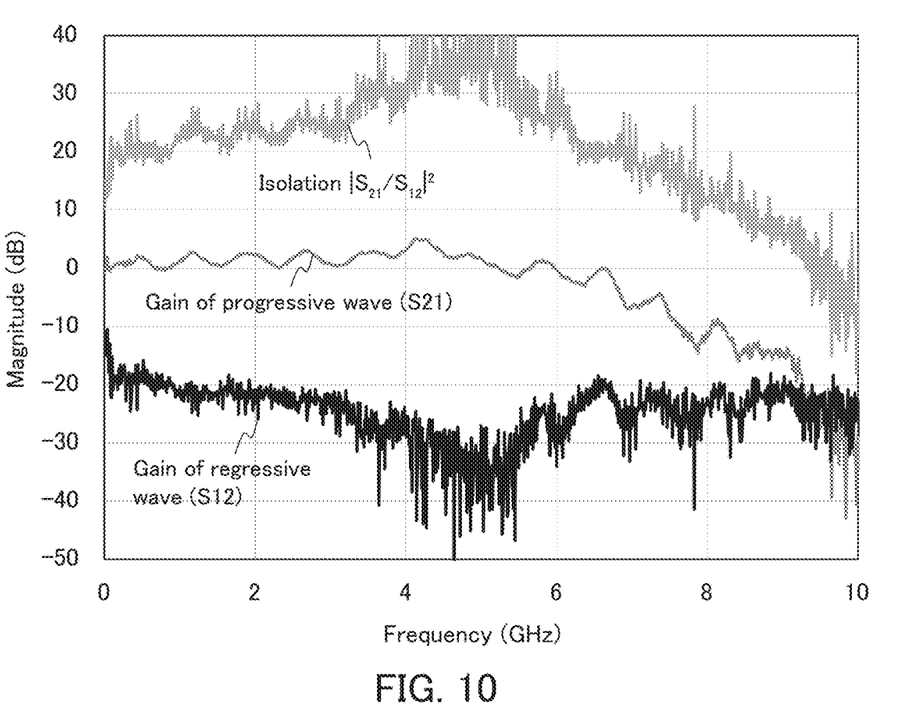
FIG. 10 is a graph showing a function of the isolator of Example 3.

FIG. 10 shows the measurement result of insertion loss in the progressive wave S21 and the regressive wave S12 within the signal frequency from 10 MHz to 10 GHz. As shown in FIG. 10, the isolation effect was demonstrated to be 20 dB or more of input/output gain. Further, a positive gain over 0 dB was observed in part of the signal frequency (without correction by the attenuator 25).

It will be obvious to those having skill in the art that many changes may be made in the above-described details of the particular aspects described herein without departing from the spirit or scope of the invention as defined in the appended claims.

What is claimed is:
1. An isolator, comprising:
  a first frequency mixer;
  a second frequency mixer;
  a local oscillator;
  a phase delayer; and a phase shifter, wherein
the first frequency mixer and the second frequency mixer are connected in series,
the local oscillator is connected to the first frequency mixer and the second frequency mixer and is configured to input a local signal with a same frequency to the first frequency mixer and the second frequency mixer,
a signal targeted for isolation is input to the first frequency mixer,
a frequency of the signal input to the first frequency mixer is up-converted by the local signal,
the second frequency mixer receives the up-converted signal via the phase delayer, a frequency of the up-converted signal is down-converted, and the down-converted signal is output from the second frequency mixer,
the phase delayer is configured to delay a phase of the up-converted signal,
the phase shifter is configured to convert a phase of the local signal received from a divider to cause a phase difference between the first frequency mixer and the second frequency mixer,
an amount of phase delay of the signal with the delayed phase and the phase difference is defined by the following equations (A) and (B), and
wherein further $\phi_{up}0$ (degree) in the equation (A) and $\phi_{LO}0$ (degree) in the equation (B) is set so as a gain of a progressive wave that moves in a direction of a signal transmission to be larger than a gain of a regressive wave that moves in an opposite direction to the direction of the signal transmission, $$\phi_{up} \text{ (degree)} = \phi_{up}0 \text{ (degree)} + 180 \text{ (degree)} \times n \quad \text{Equation (A)}$$

$\phi_{up}$ (degree): amount of phase delay
n: integer $$\phi_{LO} \text{ (degree)} = \phi_{LO}0 \text{ (degree)} + 180 \text{ (degree)} \times m \quad \text{Equation: (B)}$$

$\phi_{LO}$ (degree): phase difference
m: integer.

2. The isolator according to claim 1, wherein the first frequency mixer and the second frequency mixer are SIS quasiparticle mixers that include a superconductor-insulator-super conductor (SIS) junction structure.

3. The isolator according to claim 2, wherein the first frequency mixer and the second frequency mixer are mounted on a common substrate.

4. The isolator according to claim 2, wherein
the signal targeted for isolation and the signal output from the second frequency mixer are microwave signals, and
the isolator is for microwave uses.

5. The isolator according to claim 2, configured to operate as a unidirectional amplifier.

6. A superconducting electronic device, comprising the isolator according to claim 2.

7. The superconducting electronic device according to claim 6, wherein the superconducting electronic device is included in at least part of an electronic telescope.

8. The superconducting electronic device according to claim 6, wherein the superconducting electronic device is included in at least part of a quantum computer.

* * * * *